US005657020A

United States Patent [19]
Morand et al.

[11] Patent Number: 5,657,020
[45] Date of Patent: Aug. 12, 1997

[54] DIODE DETECTOR LOGARITHMIC RECEIVER

[75] Inventors: Jean-François Morand; Dominique Bassette, both of Saint-Cloud, France

[73] Assignee: Electronique Serge Dassault, Saint-Cloud, France

[21] Appl. No.: 349,388

[22] Filed: Apr. 26, 1989

[30] Foreign Application Priority Data

Jun. 23, 1988 [FR] France .................................. 88 08472

[51] Int. Cl.[6] .................................................... G01S 7/36
[52] U.S. Cl. ................................ 342/19; 342/89; 342/91
[58] Field of Search .............................. 342/89, 91, 19

[56] References Cited

U.S. PATENT DOCUMENTS 4,431,993  2/1984  Van Der Mark .
4,509,050  4/1985  Amaroso, Jr. et al. .
4,529,984  7/1985  Devolder et al. .
4,688,042  8/1987  Cronson et al. .

*Primary Examiner*—Mark Hellner
*Attorney, Agent, or Firm*—Nixon & Vanderhye, P.C.

[57] ABSTRACT

The device, a microwave pulse signal amplifier, includes an input (E), designed to be connected to a wideband reception head (A, H) suitable for picking up pulse emissions, on which continuous emissions can be superposed, a detection stage (1), connected to this input (E), and providing a rectified signal (SP1), and means for processing (2) the rectified signal (SP1) to establish a rectified pulse signal (SP4), rid of at least part of the effects of possible continuous emissions. The level of the continuous emissions is evaluated by a feedback loop (20, 21) activated (22) when there are no pulse emissions, and is subtracted from the level of the rectified signal (SP1).

14 Claims, 4 Drawing Sheets

DIODE DETECTOR LOGARITHMIC RECEIVER

The invention concerns logarithmic receivers of microwave signals.

This type of device is designed for installation downstream from a microwave receiver head, with antenna, to observe a broad band in the customary frequency ranges used by radars. The device is called a "receiver," although it does not, in and of itself, receive anything.

Found in these bands are pulse emissions (the most important) accompanied by emissions that are referred to as continuous ("continuous waves," or CW), and which, a priori, interfere, yet at the same time analysis of which also can be useful. The expert knows that these continuous emissions do not last indefinitely. They simply have a duration that is clearly longer than that of pulse emissions.

Logarithmic receivers can analyze parts of the frequency band, or can process the whole band, after amplitude detection followed by logarithmic amplification.

It is essentially in receivers of the second type, referred to as "diode detector" receivers, that are of interest here. They make it possible to process important dynamic characteristics of reception, typically on the order of 60 decibels, with relatively constant accuracy, regardless of the overall level of the signal processed.

It is known, however, that the logarithmic character of amplification naturally leads to volume compression. This results in significant degradation of the receiver's pulse sensitivity in the presence of a continuous emission in the band being analyzed.

Indeed, the fact of volume compression means that a pulse emission contemporaneous with a continuous emission must have a level higher (typically 3 to 6 decibels) than that of the continuous emission in order to be distinguished. The "pulse sensitivity," that is, the lowest level of detectable pulses, thus drops greatly as a function of the level of a continuous emission that possibly may be present. Further, the relationship between the level at the logarithmic amplifier's output and the level at the input depends on the continuous level.

The proposed remedy has been to insert a decoupling capacitance between diode detector and the logarithmic amplifier.

This decoupling capacitance eliminates the continuous component of the rectified signal supplied by the diode detector, but at the same time introduces a time constant that modifies the shape of the pulses and, as a result, upsets the measurement of the pulse level. Moreover, the receiver is subject to gating after each pulse, during which another possible pulse is no longer discernable. Finally, a receiver such as this has difficulty in processing emissions by high repetition frequency and higher form factor radars (HRF radars).

The invention provides a solution to these problems.

One purpose of the invention is to propose a logarithmic receiver that retains fully its pulse sensitivity, regardless of the level of continuous emission.

Another purpose of the invention is to avoid pulse deformation, as well as gating of the receiver.

The invention also has for its purpose compensating specifically for the effects attributable to the continuous component of the noise detected (the thermal noise inherent in the assembly of the reception circuit, or the parasitic reinjection noise from a local jammer).

Its purpose equally is to make it possible to process correctly emissions by high repetition frequency (HRF) radars.

Yet another purpose of the invention is to measure the continuous emission level.

Thus, the subject of the invention is a device for amplifying microwave pulse signals that includes:
- an input, designed to be connected to a wideband reception head suitable for picking up pulse emissions, on which continuous emissions can be superimposed;
- a detection stage, connected to this input, and providing a rectified signal;
- equipment for processing the rectified signal to establish a rectified pulse signal that is rid of at least part of the effects of possible continuous emissions, and;
- a logarithmic amplifier stage receiving the rectified pulse signals and providing the output signal from the amplifier device, characterized by the fact that the processing equipment includes:
  - a differential amplifier stage, the noninverting input to which is connected to the detection stage output, and the output of which is connected to the input of the logarithmic amplifier stage;
  - an analog memory circuit, the input to which receives through a controlled switch a rectified compensation signal taken from the aforesaid rectified signal, and the output of which is connected to the inverting input of the differential amplifier stage;
  - time-delay means receiving a critical signal, also taken from the aforesaid rectified signal, and suitable for opening the aforesaid switch when the critical signal level exceeds a predetermined threshold during a period of time shorter than, or equal to, a predetermined delay.

Very advantageously, the predetermined delay is adjustable, and is longer than the maximum temporal deviation separating a successive ascending transition and a descending transition of the rectified pulse signal.

In accordance with a preferred mode of realization, the critical signal and the rectified compensation signal are identical, and the critical signal can, in this case, be picked up upon leaving the logarithmic amplifier stage.

Advantageously, the time-delay means include a level comparator followed by a control logic with the predetermined delay information.

In accordance with a mode of realization, the analog memory circuit includes a resistor, one terminal of which is connected to the output of the logarithmic amplifier stage through a controlled switch, and the other terminal of which resistor is grounded through a capacitor. This second terminal, being the output from the analog memory circuit, is advantageously connected to the inverting input of the differential amplifier stage through a linear negative feedback amplifier.

In order to make it possible to measure the effects of possible continuous emissions, the processing means advantageously have an auxiliary output supplying a rectified auxiliary output signal corresponding to the effects of the continuous emissions. This auxiliary output signal advantageously is taken from a signal that is available at the output of the negative feedback amplifier.

In a preferred mode of realization, the detection stage includes a diode, preferably adjusted to function in its quadratic zone.

Other advantages and characteristics of the invention will become apparent upon examination of the detailed description that follows, and of the attached drawings, where:

The drawings, the main point of which is to show elements of a certain type, are an integral part of the description. They therefore will serve to provide a better understanding of the detailed description that follows, and at the same time will contribute to the definition of the invention, should the occasion arise.

Figure 1:
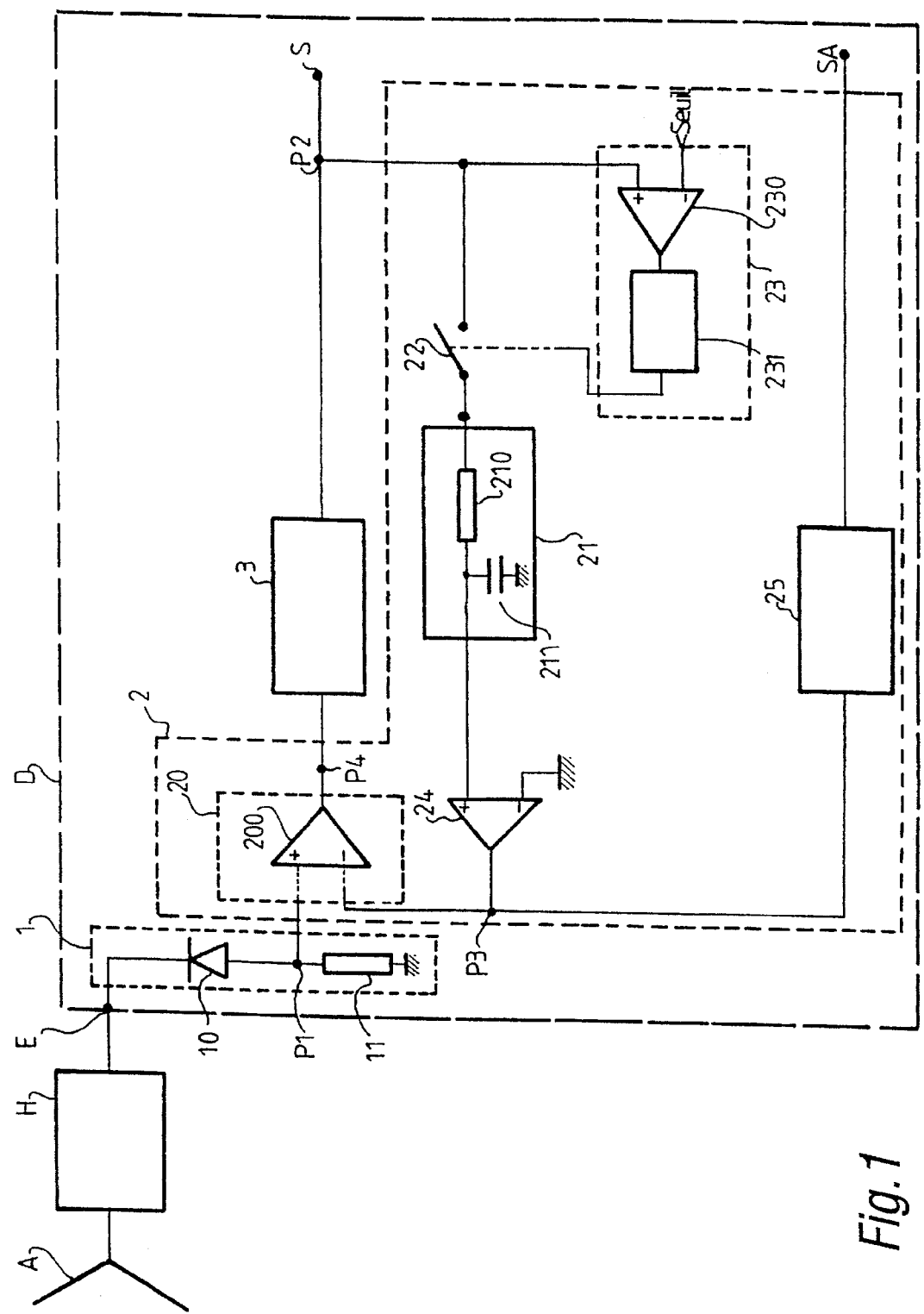
FIG. 1 is a composite diagram of a preferred mode of realization of the device in accordance with the invention.

FIG. 1 shows a microwave reception head with antenna A, as well as a microwave reception circuit H. This reception head performs wideband observation in the frequency ranges usually used by radars, and can, for example, be varied between 2 and 40 gigahertz in a countermeasures application.

The device D in accordance with the invention, is connected downstream from this head. It has input E connected to microwave reception circuit H, as well as to detection stage 1, including fast diode 10, a Schottky diode, for example, connected to input E, and adjusted to operate in its quadratic zone. This diode is polarized by resistor 11, its output being grounded.

The diode's output is connected to processing means 2, followed by logarithmic amplifier 3, which provides output S from amplifier device D.

Differential amplifier stage 20 is contained in the head of these processing means and consists of amplifier 200 with an amplification factor of 1, the noninverting input of which is connected to the output of diode detector 10. The output of amplifier 200 is connected to the input of logarithmic amplifier stage 3.

Analog memory circuit 21 includes resistor 210, one terminal of which is connected to the output of logarithmic amplifier stage 3 through controlled switch 22. The other terminal of this resistor is grounded through capacitor 211, and to the noninverting input of negative feedback amplifier 23, adjusted to operate in its linear domain. The inverting input of this negative feedback amplifier 24 is grounded. Its output is connected to the inverting input of amplifier 200 in the differential amplifier stage 20, and to auxiliary output SA of device D through supplementary logarithmic amplifier stage 25, similar to logarithmic amplifier stage 3.

Switch 22 is controlled by time-delay means 23, which include, schematically, level comparator 230, the noninverting input of which is connected to the output of logarithmic amplifier stage 3, and the inverting input of which is adapted to receive a threshold value. The output of this comparator is connected to the input of control logic 231, the output of which supplies a control signal for switch 22. Control logic 231 includes a time counter and contains information relative to predetermined delay T, the significance of which will be explained in what follows. It should be understood that the term "switch" used here to designate the function of interruption, or noninterruption, of the connection in no way prejudices the material realization of this interruption function. On this score, the technology used for the material realization of the time-delay means and the controlled switch is selected to permit extremely rapid switching.

The threshold applied to the inverting input of comparator 230 is slightly below the minimum level of pulse emissions. It is possible, for example, to take a suitable fraction of the reference voltage from an analog/digital converter used downstream from the output of the device for the analog/digital conversion of signal SP2.

Analog memory circuit 21, negative feedback amplifier 24, and amplifier 200 make up a first order feedback loop, activated, or not, by switch 22.

Figure 2:
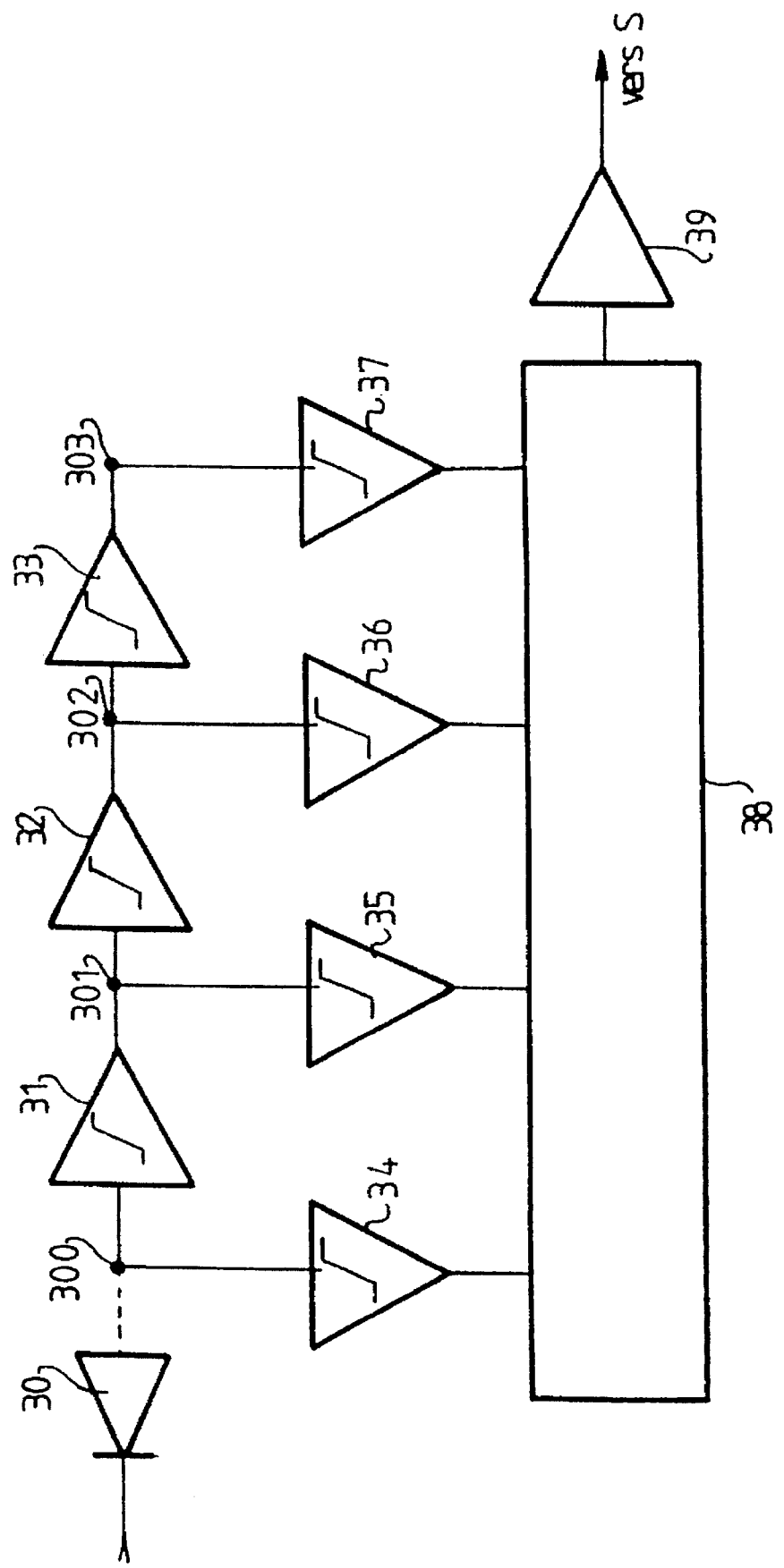
FIG. 2 is a composite diagram of a logarithmic amplifier stage of the device in FIG. 1.

FIG. 2 shows in detailed fashion an advantageous mode of realization of a logarithmic amplifier stage that can be applicable to stage 3 and/or stage 25 in FIG. 1.

Fast diode 30, a single detection head, is followed by a cascade of over-driven linear amplifiers 31 through 33. The four nodes, 300 through 303, of this cascade are connected, respectively, to four overdriven linear amplifiers, 34 through 37, the outputs of which are connected to the inputs of logarithmic summer 38. Finally, the output of the latter is connected to terminal amplifier 39.

In accordance with the invention, the role of diode 30 can be played by diode 10 in the case of amplifier stage 3.

The operation of the device now will be described.

Input E receives a microwave signal corresponding to the capture by reception head A, H, of pulse emissions on which possible continuous emissions can be superimposed. Diode detector 1 then supplies rectified voltage SP1 at its output (point P1), the amplitude of which voltage varies linearly with the power of the input signal since the diode is adjusted to function in its quadratic zone. Rectified signal SP1 has a pulse component due to an emission "pulse" on which, possibly, a continuous component due to a continuous emission (CW) is superimposed. (In theory, these long continuous emissions also could be termed pulses, but radar specialists tend to reserve the word "pulses" for short microwave emissions, and to speak of long microwave emissions as continuous waves.) It should be understood that since the rectified signal corresponds to a single power, its amplitude is equal to the sum of the respective amplitudes of the pulse and continuous components.

The general operating principle of the device is as follows.

Activation of the feedback loop (switch 22 closed) slaves signal SP2 at the output of the logarithmic amplifier with respect to a desired value by supplying to point P3 an adequate correction signal SP3. Because the feedback loop is first order, its output, SP2, has a "position error," DSP2. The threshold of comparator 230 is selected greater than the value of DSP2. The loop is designed to keep the temporal variation in DSP2 as small as possible.

When the feedback loop is not activated (switch 22 open), the preceding level of signal SP3 is maintained by the character set of analog memory 21.

As will be seen further on, the feedback loop is deactivated during each "pulse" and is activated when there are no "pulses."

Since the feedback loop is activated only when there are no "pulses", signal SP3 represents only the "continuous component" of rectified signal SP1, erroneous by the loop's "position error."

When signal SP1 is due solely to a continuous emission, signal SP4 at the output of differential amplifier 20 is approximately zero, "except for the position error." Signal SP2 then takes the value DSP2, note being taken of the fact that logarithmic amplification assumes a zero output signal SP2 for a zero input signal SP4 [amplification law in the form SP2=log(SP4+1)].

When signal SP1 contains a "pulse," signal SP4 then represents the only "pulse component" of the rectified signal, rid of the main point of the effects of continuous emissions (except for loop "position error"). Signal SP2 then represents a "rectified pulse signal" amplified logarithmically and without having suffered volume compression, the position error disregarded.

Thus, the sensitivity of the device is retained, regardless of the level of continuous emissions encountered. Moreover, the amplified level of these continuous emissions, except for the position error, is available at auxiliary output SA, which thus provides a "continuous rectified signal."

Operation of the feedback loop here is special. Amplifier 3 has a logarithmic response over its direct path, but its return path (amplifier 24), on the other hand, is linear. What is subtracted from signal SP1 at the moment in time when it activates the feedback loop in amplifier 200 thus is not proportional to the "continuous component" contained in signal SP1, but rather to its logarithm. It is the detection of the threshold by comparator 230, associated with the gain of amplifier 24, that causes signal SP3 to tend toward the "continuous component" of signal SP1.

The expert will understand that this contributes to the stability of the feedback loop.

It thus is important to differentiate between a pulse of a rectified continuous signal and a pulse of a rectified pulse signal. For this, time-delay means 23 uses signal SP2 at the output of logarithmic amplifier stage 3, which thus appears here as being a critical signal, in the sense that it is an aid to the decision, and at the same time is a compensation signal, since it is at the origin of compensation at differential amplifier stage 20.

Figure 3:
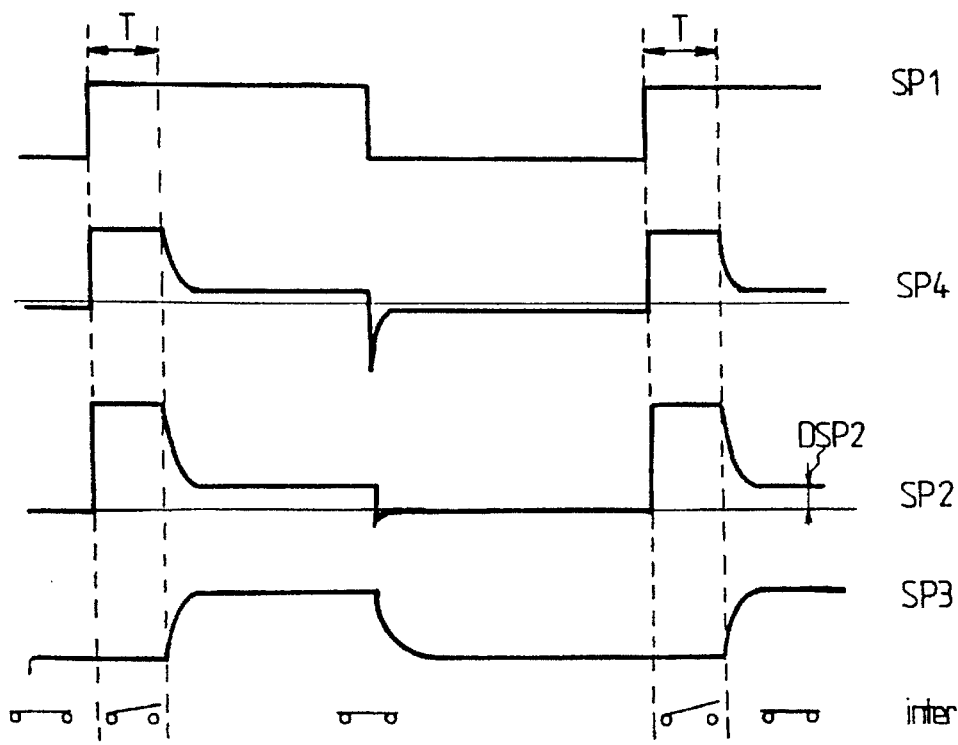
FIGS. 3 through 5 show the shapes of the different parts of the characteristic signals that appear as the device functions.
Figure 4:
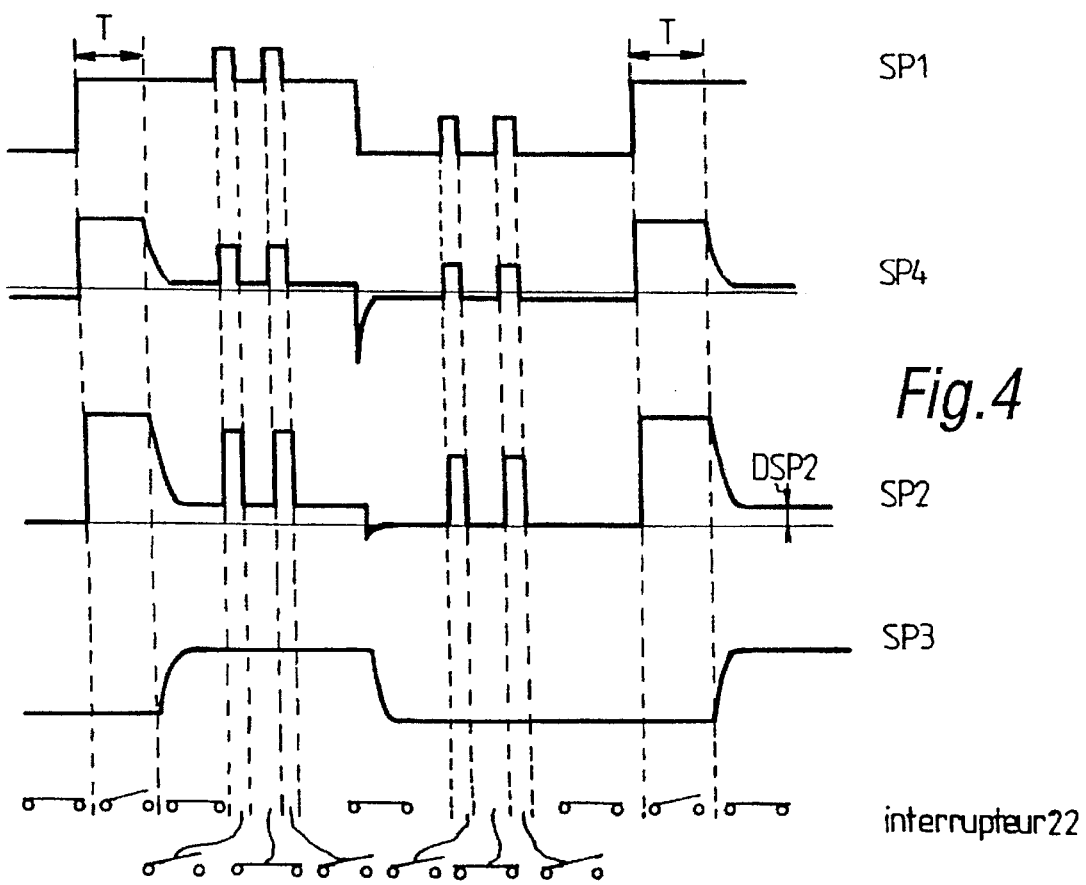
Figure 5:
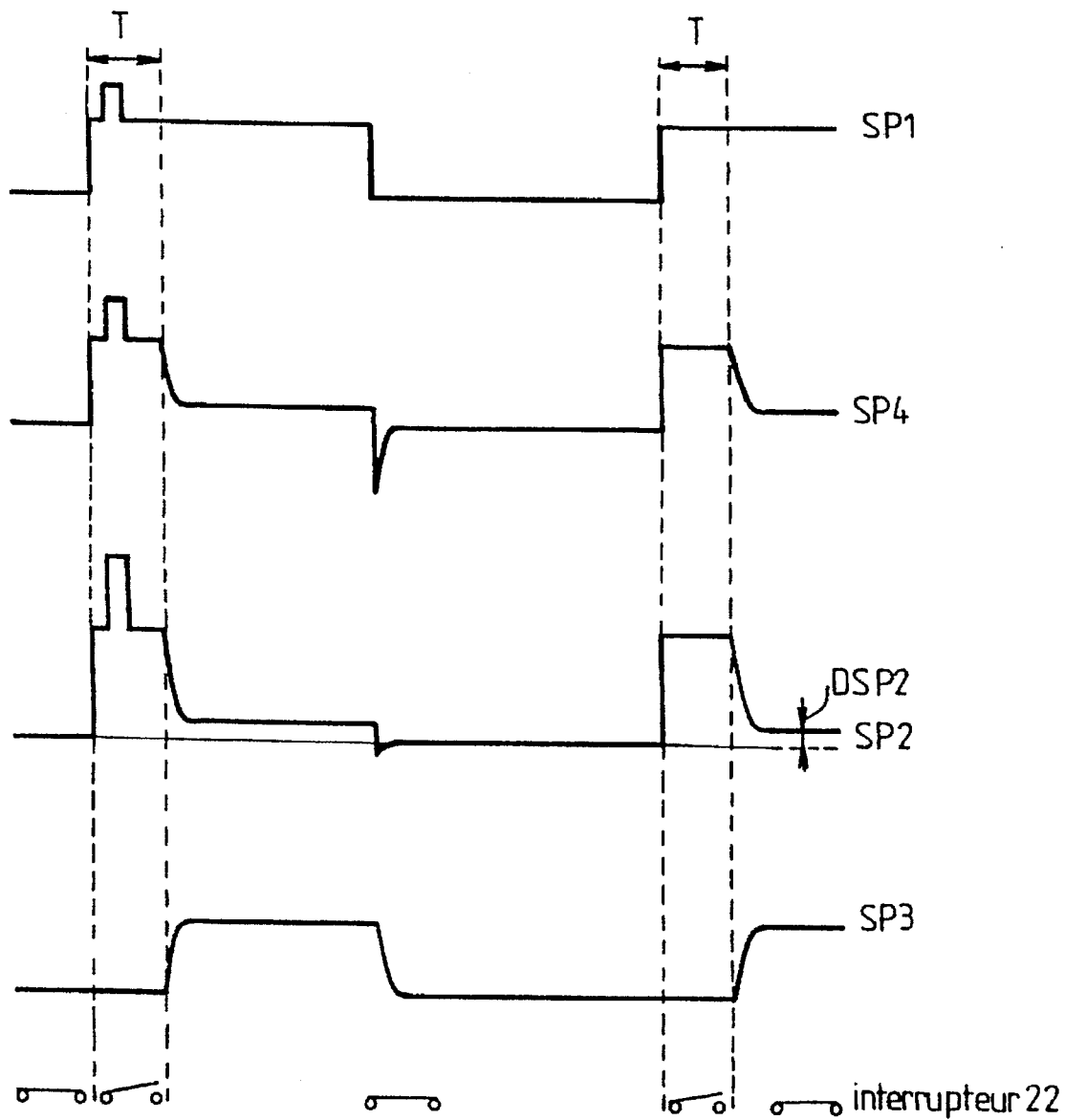

It is necessary now to refer in particular to FIGS. 3 through 5 to illustrate this differentiation between the different pulses. Each figure is that of the temporal diagrams representing, from top to bottom, part of signals SP1, SP4, SP2, and SP3, respectively.

FIG. 3 is for the case of part of rectified signal SP1 without a pulse component. Switch 22 is closed before the appearance of the first ascending transition of signal SP1. Once this ascending transition appears, it is met again in signal SP4, and is amplified to signal SP2. The level of signal SP2 then is higher than the threshold of comparator 230, which causes the latter to supply a logic signal to control logic 231, which opens switch 22, since there is an ascending transition, and thus the presumption of a "pulse."

Control logic 231 holds switch 22 open while awaiting the appearance of a descending transition, which would signify the end of the "pulse." This transition does not intervene at the expiration of predetermined delay T, signifying that this ascending transition corresponds to the appearance of a continuous component. There thus are grounds for closing switch 22 and activating the feedback loop. The duration of T is adjustable as a function of the application, and, perhaps, typically, is on the order of three times the maximum "pulse" width.

The feedback loop is activated when switch 22 closes. After a transitory mode, the duration of which depends on the intrinsic characteristics of the loop, the level of signal SP2 stabilizes at the aforesaid value DSP2, the level of signal SP3 stabilizes at a value corresponding, except for the position error, to that of signal SP1, and signal SP4, except for the position error, corresponds to the here non-existent pulse component.

The level of signal SP2 remains below that of the threshold of comparator 230 during the descending transition of signal SP1, and the switch remains closed. However, a transitory mode, identical to that already described, appears in signal SP4. On the other hand, this transitory mode is nonresponsive in signal SP2 because logarithmic amplifier 3 clips the negative input voltages.

FIG. 4 is for the case of part of rectified signal SP1 with a "pulse" arriving after the expiration of delay T and following the appearance of an ascending transition of a continuous emission. Operation of the device is identical to that described in FIG. 3 until the appearance of the first "pulse." The control logic opens switch 22 upon its appearance and deactivates the feedback loop. Signal SP3, representing the preceding level of the continuous component, is subtracted from signal SP1, resulting in signal SP4, representing only the pulse component, with the position error excepted. Amplified pulse component SP2 then is supplied to output S while signal SP3, amplified, is supplied to auxiliary output SA. Upon the appearance of the descending transition, which takes place before the expiration of delay T, the control logic closes switch 22 because the level of signal SP2 is now below the threshold of the comparator, and reactivates the feedback loop to evaluate once again the level of the continuous component. Operation repeats with the following "pulse."

FIG. 5 is for the case of part of rectified signal SP1 with a "pulse" arriving before the expiration of delay T and following the appearance of an ascending transition of a continuous component.

Switch 22 is opened, deactivating the feedback loop, upon the appearance of the first ascending transition (corresponding to a continuous component). Switch 22 is held open upon the appearance of the second ascending transition (corresponding to a "pulse"). The level of signal SP2 remains higher than the threshold upon the appearance of the descending transition of the "pulse," and switch 22 is held open until the expiration of delay T. The result is signal shapes comparable to those in FIG. 3.

Of course, the durations of continuous emissions, and of "pulses," vary as a function of applications. The same is true for predetermined duration T, and for the system's different time constants. Continuous emissions such as these can have a duration of several seconds in a special application, whereas the "pulses" have a width between 0.1 and 100 microseconds, for example. Duration T in this case is taken equal to a fraction of a millisecond, and the duration of the transitory mode in the feedback loop is on the order of a microsecond for a closed loop, whereas memory 21 in an open loop holds for a time that can be as long as a second.

The device in accordance with the invention makes it possible, in particular, to compensate for the effects of the continuous component of the thermal noise detected and inherent in the reception circuit assembly.

Better still, the expert knows that devices such as the one proposed often are installed on a platform, fixed or mobile, equipped with a jammer that can be of the continuous noise type (or equivalent). In such case the proposed device has a basic advantage, that of eliminating the continuous component of such noise, which is reinjected into its circuits in parasitic fashion. Put another way, the device is "decoupled" from the local jammer.

"Pulses" are not deformed, and the device is not subject to gating after each pulse. Further, the quickness of the time-delay means and of switch 22 make it possible to deal with the threats emanating from HRF radars.

As has been indicated above, a device such as this finds its field of application in the case of wideband observations, and its employment is particularly advantageous in the case of radio direction finder receivers that can receive different continuous levels on each antenna. The measurement of the angle of arrival thus is not disturbed.

The invention is not limited to the mode of realization described above, but rather includes all variants, the following in particular:

while it is preferable to have diode detector 10 work in its quadratic zone, it is possible to have it function in its linear zone. The sensitivity of the device is somewhat degraded, however, so the absolute level measurement, false, then requires a software correction as a function of the level of the continuous components measured;

time-delay means 23 has been represented for purposes of simplification by a level comparator and a control logic that includes, in particular, a duration counter. Of course, the sophistication of these time-delay means is more important, and depends in particular on the application;

critical and compensation signals are identical in this mode of realization. Other realizations, in which the compensation signal would be distinct from the critical signal, and would be coming from a source other than the output of logarithmic amplifier stage 3, also could be considered.

The mode of realization of amplifier stage 3 is particularly advantageous. Other types of logarithmic amplifier stages could be used, however.

Detection of rectified signal transitions is effected in this mode of realization by comparing signal SP2 to a threshold. However, this detection could be made by observing the variation in signal SP2.

Of course, certain of the above described means can be omitted in those variants in which they would serve no useful purpose.

We claim:

1. A microwave pulse signal amplifier device, that includes:
   an input (E), designed to be connected to a wideband reception head (A, H) suitable for picking up pulse emissions, on which continuous emissions can be superimposed;
   a detection stage (1), connected to this input (E), and providing a rectified signal (SP1);
   equipment for processing (2) the rectified signal (SP1) to establish a rectified pulse signal that is rid of at least part of the effects of possible continuous emissions; and
   a logarithmic amplifier stage (3) receiving the rectified pulse signal (SP4) and providing the output signal (SP2) from the amplifier device, characterized by the fact that the processing equipment (2) includes:
   a differential amplifier stage (20), the noninverting input to which is connected to the detection stage (2) output, and the output of which is connected to the input to the logarithmic amplifier stage (3);
   an analog memory circuit (21), the input to which receives, through a controlled switch (22), a rectified compensation signal (SP2), taken from the aforesaid rectified signal (SP1), and the output of which is connected to the inverting input of the differential amplifier stage (20);
   time-delay means (23) receiving a critical signal (SP2), also taken from the aforesaid rectified signal (SP1) and suitable for opening the aforesaid switch (22) when the critical signal (SP2) level exceeds a predetermined threshold during a period of time shorter than, or equal to, a predetermined delay (T).

2. A device in accordance with claim 1, characterized by the fact that the predetermined delay (T) is adjustable and longer than the maximum temporal deviation separating a successive ascending transition and a descending transition of the rectified pulse signal.

3. Device in accordance with one of claims 1 and 2, characterized by the fact that the predetermined threshold is slightly below the minimum level of the pulse emissions.

4. Device in accordance with one of claims 1 through 3, characterized by the fact that the critical signal and the rectified compensation signal are identical.

5. Device in accordance with one of claims 1 through 4, characterized by the fact that the critical signal (SP2) is picked off at the output of the logarithmic amplifier stage (3).

6. Device in accordance with one of the preceding claims, characterized by the fact that the time-delay means (23) include a level comparator (230) followed by a control logic (231) containing the predetermined delay information.

7. Device in accordance with one of the preceding claims, characterized by the fact that the analog memory circuit (21) includes a resistor (210), one terminal of which is connected to the output of the logarithmic amplifier stage (3) through switch (22), the other terminal of which is connected to ground through a capacitor (211), and by the fact that this latter terminal, being the output of the analog memory circuit, is connected to the inverting input of the differential amplifier stage through a linear negative feedback amplifier (24).

8. Device in accordance with one of the preceding claims, characterized by the fact that the logarithmic amplifier stage (3) includes a cascade of overdriven linear amplifiers (31–33), the nodes of which are connected to the inputs of a logarithmic summer (38) through other overdriven linear amplifiers (34–37), and by the fact that the output of this logarithmic summer is connected to the output of the logarithmic amplifier stage (3) through a terminal amplifier (39).

9. Device in accordance with one of the preceding claims, characterized by the fact that the processing means (2) have an auxiliary output (SA) supplying an auxiliary rectified output signal corresponding to the effects of the continuous emissions.

10. Device in accordance with claim 7 characterized by the fact that the auxiliary output signal is taken from the signal (SP3) available at the output of the negative feedback amplifier (24), and by the fact that the auxiliary output is connected to the output of the negative feedback amplifier (24) through a supplementary logarithmic amplifier stage (25).

11. Device in accordance with claim 10, characterized by the fact that the supplementary logarithmic amplifier stage (25) is identical to the logarithmic amplifier stage (3).

12. Device in accordance with one of the preceding claims, characterized by the fact that the detection stage (1) includes a diode (10).

13. Device in accordance with claim 12, characterized by the fact that the diode (10) is adjusted to function in its quadratic zone.

14. Device in accordance with one of the preceding claims, characterized by the fact that it is associated with a platform, fixed, or mobile, including a jammer.

\* \* \* \* \*